(12) United States Patent
Maeda et al.

(10) Patent No.: US 9,159,752 B2
(45) Date of Patent: Oct. 13, 2015

(54) SOLID-STATE IMAGE PICKUP DEVICE, AND CAMERA MODULE

(71) Applicant: Kabushiki Kaisha Toshiba, Minato-ku (JP)

(72) Inventors: Motohiro Maeda, Oita (JP); Nagataka Tanaka, Oita (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/093,632

(22) Filed: Dec. 2, 2013

(65) Prior Publication Data

US 2015/0002712 A1    Jan. 1, 2015

(30) Foreign Application Priority Data

Jun. 27, 2013   (JP) .................................. 2013-135122

(51) Int. Cl.
*H01L 31/062* (2012.01)
*H01L 27/146* (2006.01)
*H04N 5/335* (2011.01)

(52) U.S. Cl.
CPC ...... *H01L 27/14607* (2013.01); *H01L 27/1461* (2013.01); *H01L 27/14603* (2013.01); *H01L 27/14612* (2013.01); *H04N 5/335* (2013.01)

(58) Field of Classification Search
CPC . H01L 27/14; H01L 27/14607; H01L 27/146; H01L 27/14603
See application file for complete search history.

(56) References Cited

U.S. PATENT DOCUMENTS

| 7,154,137 | B2 * | 12/2006 | Nozaki | 257/292 |
|---|---|---|---|---|
| 7,714,402 | B2 | 5/2010 | Iida | |
| 2003/0209743 | A1 * | 11/2003 | Park | 257/290 |
| 2007/0080413 | A1 * | 4/2007 | Kwak | 257/431 |
| 2008/0211047 | A1 * | 9/2008 | Iida | 257/432 |
| 2011/0109775 | A1 * | 5/2011 | Amano | 348/241 |
| 2012/0217602 | A1 * | 8/2012 | Enomoto | 257/432 |

FOREIGN PATENT DOCUMENTS

| JP | 4-42574 | 2/1992 |
|---|---|---|
| JP | 2001-44400 | 2/2001 |
| JP | 2005-332925 | 12/2005 |
| JP | 2006-140331 A | 6/2006 |
| JP | 2008-218670 | 9/2008 |
| JP | 2009-88045 A | 4/2009 |
| JP | 2011-108824 | 6/2011 |
| KR | 10-2003-0056060 A | 7/2003 |
| KR | 10-2009-0083292 A | 8/2009 |

OTHER PUBLICATIONS

Office Action issued Dec. 23, 2014 in Korean Patent Application No. 10-2013-0147352 (with English language translation).

* cited by examiner

*Primary Examiner* — Bilkis Jahan
(74) *Attorney, Agent, or Firm* — Oblon, McClelland, Maier & Neustadt, L.L.P.

(57) ABSTRACT

According to one embodiment, a solid-state image pickup device includes a pixel array that includes a two-dimensionally arranged matrix of photoelectric conversion elements corresponding to pixels of a picked-up image. Each of the photoelectric conversion elements includes a first conductive semiconductor region and a second conductive semiconductor region between which an uneven junction plane is formed.

9 Claims, 6 Drawing Sheets

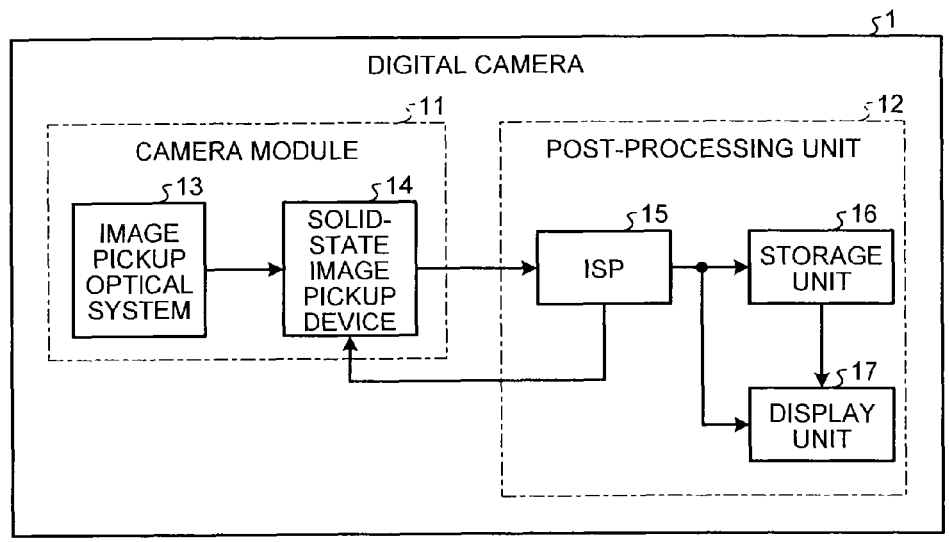
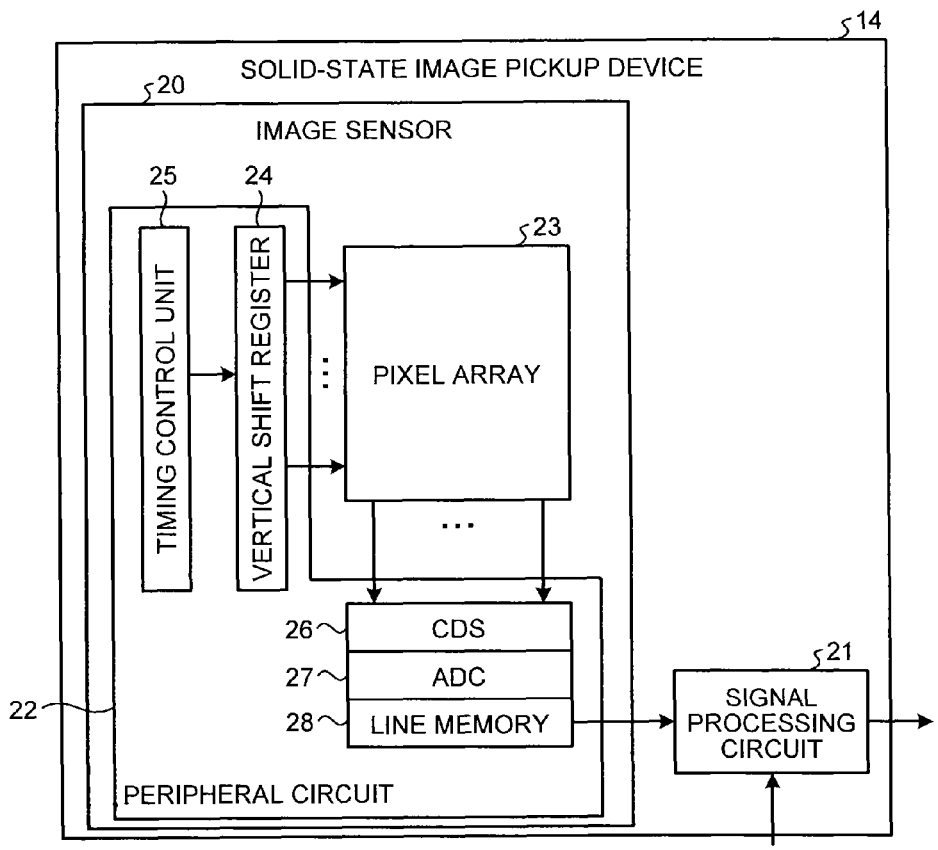

SOLID-STATE IMAGE PICKUP DEVICE, AND CAMERA MODULE

CROSS-REFERENCE TO RELATED APPLICATION

This application is based upon and claims the benefit of priority from Japanese Patent Application No. 2013-135122, filed on Jun. 27, 2013; the entire contents of which are incorporated herein by reference.

FIELD

Embodiments described herein relate generally to a solid-state image pickup device, a method of fabricating the solid-state image pickup device, and a camera module.

BACKGROUND

In the related art, an electronic device such as a digital camera or a mobile terminal with camera function is provided with a camera module including a solid-state image pickup device. The solid-state image pickup device includes a plurality of photoelectric conversion elements arranged two-dimensionally corresponding to each pixel of a picked-up image. Each of the photoelectric conversion elements photoelectrically converts incident light into a quantity of electric charges (for example, electrons) corresponding to a light-received quantity to accumulate as information indicating luminance of each pixel.

In such solid-state image pickup device, miniaturization of the photoelectric conversion element has proceeded with downsizing of the device. As the miniaturization of the photoelectric conversion element proceeds, since the number of electrons to be accumulated by each of the photoelectric conversion elements, so-called the number of saturated electrons becomes less, reproduction characteristic of the picked-up image is reduced. In solid-state image pickup device, therefore, the photoelectric conversion element capable of increasing the number of saturated electrons in a limited region is desired.

BRIEF DESCRIPTION OF THE DRAWINGS

FIG. 1 is a block diagram illustrating a schematic configuration of a digital camera provided with a solid-state image pickup device according to a first embodiment;

FIG. 2 is a block diagram illustrating a schematic configuration of the solid-state image pickup device according to the first embodiment;

DETAILED DESCRIPTION

Figure 3:
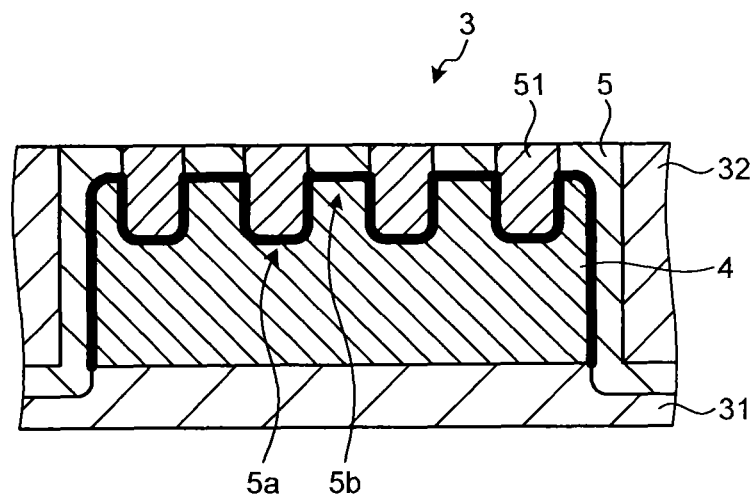
FIG. 3 is an explanatory diagram of a photoelectric conversion element in cross-sectional view according to the first embodiment.

In general, according to one embodiment, a solid-state image pickup device includes a pixel array that includes a two-dimensionally arranged matrix of photoelectric conversion elements corresponding to pixels of a picked-up image. Each of the photoelectric conversion elements includes a first conductive semiconductor region and a second conductive semiconductor region between which an uneven junction plane is formed.

Exemplary embodiments of a solid-state image pickup device, a method of fabricating the solid-state image pickup device, and a camera module will be explained below in detail with reference to the accompanying drawings. The present invention is not limited to the following embodiments.

First Embodiment

FIG. 1 is a block diagram illustrating a schematic configuration of a digital camera 1 provided with a solid-state image pickup device 14 according to a first embodiment. As illustrated in FIG. 1, the digital camera 1 includes a camera module 11 and a post-processing unit 12.

The camera module 11 includes an image pickup optical system 13 and the solid-state image pickup device 14. The image pickup optical system 13 receives light from an object to form an object image. The solid-state image pickup device 14 picks up the object image formed by the image pickup optical system 13 and outputs an image signal obtained by the image pickup to the post-processing unit 12. Such camera module 11 is applied to, for example, an electronic device such as a mobile terminal with camera in addition to the digital camera 1.

The post-processing unit 12 includes an ISP (Image Signal Processor) 15, a storage unit 16, and a display unit 17. The ISP 15 carries out a signal processing of the image signal input from the solid-state image pickup device 14. The ISP 15 carries out a high-quality picture processing such as, for example, a noise removal processing, a dead pixel correction processing, and a resolution conversion processing.

Further, the ISP 15 outputs the image signal after the signal processing to the storage unit 16, the display unit 17 and a signal processing circuit 21 (see FIG. 2), which will be described later, provided in the solid-state image pickup device 14 within the camera module 11. The image signal fed back to the camera module 11 from the ISP 15 is used for adjustment or control of the solid-state image pickup device 14.

The storage unit 16 stores the image signal input from the ISP 15 as an image. In addition, the storage unit 16 outputs the image signal of the stored image to the display unit 17 depending on an operation of a user. The display unit 17 displays the image depending on the image signal input from the ISP 15 or the storage unit 16. Such display unit 17 is, for example, a liquid crystal display.

The solid-state image pickup device 14 provided in the camera module 11 will be described below with reference to FIG. 2. FIG. 2 is a block diagram illustrating a schematic configuration of the solid-state image pickup device 14 according to the first embodiment. As illustrated in FIG. 2, the solid-state image pickup device 14 includes an image sensor 20 and a signal processing circuit 21.

Here, the image sensor 20 which is a so-called back-illuminated CMOS (Complementary Metal Oxide Semiconductor) image sensor will be described. In the CMOS image sensor, a wiring layer is formed on a surface opposite to a surface of the photoelectric conversion element which incident light enters, the photoelectric conversion element photoelectrically converting the incident light.

Further, the image sensor 20 according to the present embodiment is not limited to the back-illuminated CMOS image sensor, but may be arbitrary image sensors such as a front-illuminated CMOS image sensor or CCD (Charge Coupled Device) image sensor.

The image sensor 20 includes a peripheral circuit 22 and a pixel array 23. In addition, the peripheral circuit 22 includes a vertical shift register 24, a timing control unit 25, a CDS (correlated double sampling unit) 26, an ADC (analog/digital converting unit) 27, and a line memory 28.

The pixel array 23 is provided in an image pickup region of the image sensor 20. In the pixel array 23, a plurality of photoelectric conversion elements corresponding to each pixel of the picked-up image are disposed in a form of two-dimensional array (matrix form) in a horizontal direction (row direction) and a vertical direction (column direction). Then, the pixel array 23 accumulates signal charges (for example, electrons) generated depending on the quantity of the incident light by each of the photoelectric conversion elements corresponding to each pixel.

The timing control unit 25 is a processing unit that outputs a pulse signal acting as a reference of operation timing with respect to the vertical shift register 24. The vertical shift register 24 is a processing unit that outputs a selection signal to the pixel array 23, the selection signal being used to sequentially select the photoelectric conversion element which reads the signal charge out of the plurality of photoelectric conversion elements disposed in the form of array (matrix), by the row.

The pixel array 23 outputs the signal charge accumulated in each of the photoelectric conversion elements, which is selected through the selection signal input from the vertical shift register 24 by the row, to the CDS 26 from the photoelectric conversion element, as the pixel signal indicating the luminance of each pixel.

The CDS 26 is a processing unit that removes a noise from the pixel signal input from the pixel array 23 by the correlated double sampling and then outputs it to the ADC 27. The ADC 27 is a processing unit that converts an analog pixel signal input from the CDS 26 to a digital pixel signal and then outputs it to the line memory 28. The line memory 28 is a processing unit that temporarily holds the pixel signal input from the ADC 27 and outputs it the signal processing circuit 21 for each row of the photoelectric conversion element in the pixel array 23.

The signal processing circuit 21 is a processing unit that performs a predetermined signal processing on the pixel signal input from the line memory 28 and outputs it the post-processing unit 12. The signal processing circuit 21 performs the signal processing such as, for example, lens shading correction, flaw correction, and noise reduction processing on the pixel signal.

Like this, in the image sensor 20, the plurality of photoelectric conversion elements disposed in the pixel array 23 photoelectrically convert the incident light into the signal charge of the quantity corresponding to the light-received quantity and accumulates the converted signal charge, and the peripheral circuit 22 reads the signal charge accumulated in each of the photoelectric conversion elements as the pixel signal, thus performing the image pickup.

Each of the photoelectric conversion elements disposed in the pixel array 23 of the image sensor 20 is a photodiode which is formed by PN junction between a first conductive-type (herein, referred to as an "N-type") semiconductor (herein, referred to as a "Si: silicon") region and a second conductive-type (herein, referred to as a "P-type") Si region.

Then, the photoelectric conversion element accumulates the signal charge (herein, "electron"), which is generated by photoelectrically converting the incident light, in the junction portion between the N-type Si region and the P-type Si region. Therefore, as the area of the junction plane between the N-type Si region and the P-type Si region is large, the number of accumulable electrons (hereinafter, referred to as "the number of saturated electrons") of the photoelectric conversion element increases.

However, as miniaturization of the photoelectric conversion element proceeds with downsizing of the solid-state image pickup device 14, since the area of the junction plane between the N-type Si region and the P-type Si region is reduced in each of the photoelectric conversion elements, the number of saturated electrons of each photoelectric conversion element becomes less and thus reproduction characteristics of the picked-up image decreases.

In the solid-state image pickup device 14 according to the first embodiment, therefore, each of the photoelectric conversion elements is configured to increase the number of saturated electrons within the limited region. A configuration of the photoelectric conversion element according to the first embodiment will be described below with reference to FIGS. 3 and 4.

Figure 4:
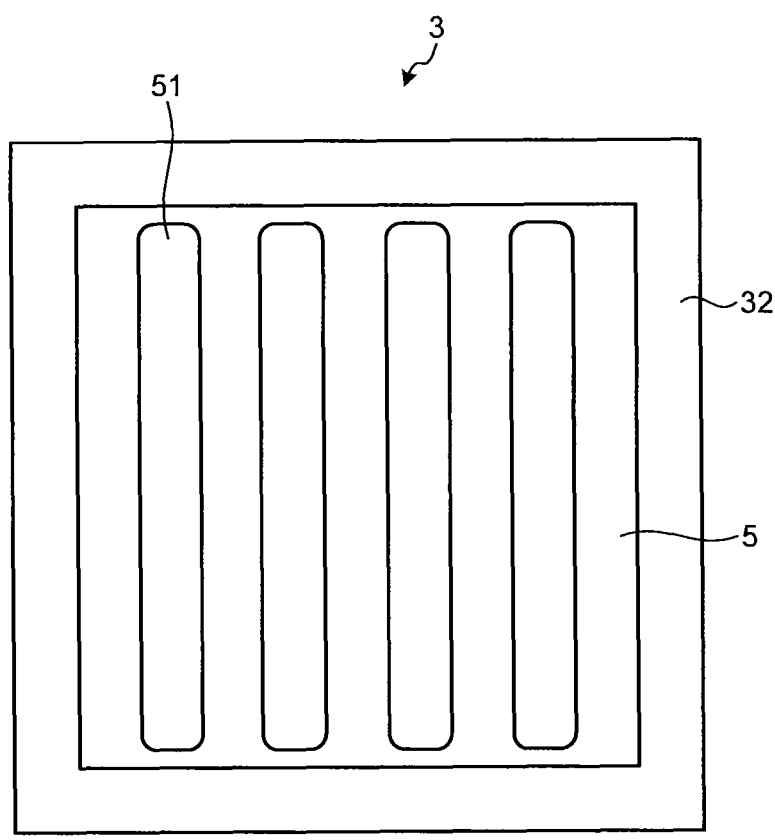
FIG. 4 is an explanatory diagram of the photoelectric conversion element in plan view according to the first embodiment.

FIG. 3 is an explanatory diagram of a photoelectric conversion element 3 in cross-sectional view according to the first embodiment, and FIG. 4 is an explanatory diagram of the photoelectric conversion element 3 in plan view according to the first embodiment. Further, FIG. 4 illustrates schematically a cross section of the photoelectric conversion element 3 corresponding to one pixel of the picked-up image taken along a direction perpendicular to a light receiving surface. In addition, FIG. 4 illustrates schematically the light receiving surface of the photoelectric conversion element 3 corresponding to one pixel of the picked-up image.

As illustrated in FIG. 3, the photoelectric conversion element 3 includes an N-type Si region 4 provided on a semiconductor substrate 31 such as a Si wafer and a first P-type Si region 5 provided on an upper face and a lateral face of the N-type Si region 4. Further, a Shallow Trench Isolation (STI) 32 is formed at an outer side more than the first P-type Si region 5 provided on the lateral face of the N-type Si region 4. Each of the photoelectric conversion elements 3 is electrically isolated from an adjacent other photoelectric conversion element 3 by the STI 32.

Furthermore, the photoelectric conversion element 3 includes a plurality of second P-type Si regions 51 provided so as to protrude toward the N-type Si region 4 from the junction plane between the first P-type Si region 5 provided at the upper face portion of the N-type Si region 4 and the N-type Si region 4.

As illustrated in FIG. 4, the second P-type Si regions 51 are provided so as to be in the form of stripe in plan view, and the second P-type Si regions 51 are provided so as to be parallel with each other and be parallel with the light-receiving surface of the photoelectric conversion element 3. Further, hereinafter, in a case of aiming a P-type semiconductor region formed by the first P-type Si region 5 and the second P-type Si regions 51, it is simply referred to as "P-type Si region".

Thus, the photoelectric conversion element 3 includes the second P-type Si regions 51 protruding in a depth direction toward the N-type Si region 4 from the first P-type Si region 5, in addition to the first P-type Si region 5. For this reason, in the photoelectric conversion element 3, the PN junction is formed at the junction portion between the N-type Si region 4 and the first P-type Si region 5 and the PN junction is also formed at the junction portion between the N-type Si region 4 and the second P-type Si regions 51.

In the photoelectric conversion element 3, that is, as illustrated by a thick line in FIG. 3, the junction plane between the N-type Si region 4 and the P-type Si region has a concave/convex shape which are formed with a convex portion 5a protruding toward the semiconductor substrate 31 and a concave portion 5b concaved toward the light-receiving surface of the photoelectric conversion element 3. Therefore, according to the photoelectric conversion element 3, since the area of the junction plane between the N-type Si region 4 and the P-type Si region, that is, the area of the PN junction is enlarged compared to another photoelectric conversion element not provided with the second P-type Si region 51, it is possible to increase the number of saturated electrons.

Further, the present embodiment is described on the case provided so that the second P-type Si regions 51 are parallel with each other as viewed from plane and are parallel with the light-receiving surface of the photoelectric conversion element 3, but the shape of the second P-type Si regions 51 as viewed from plane is not limited thereto.

Figure 5:
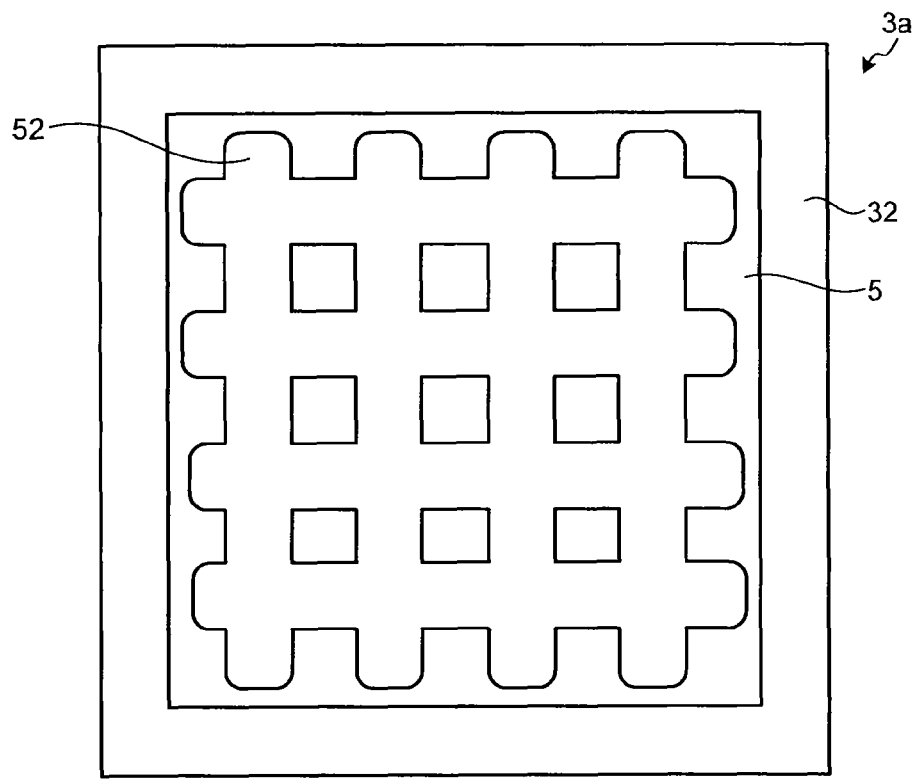
FIG. 5 is an explanatory diagram of a light-receiving surface in a photoelectric conversion element in plan view according to a first modified example.
Figure 6:
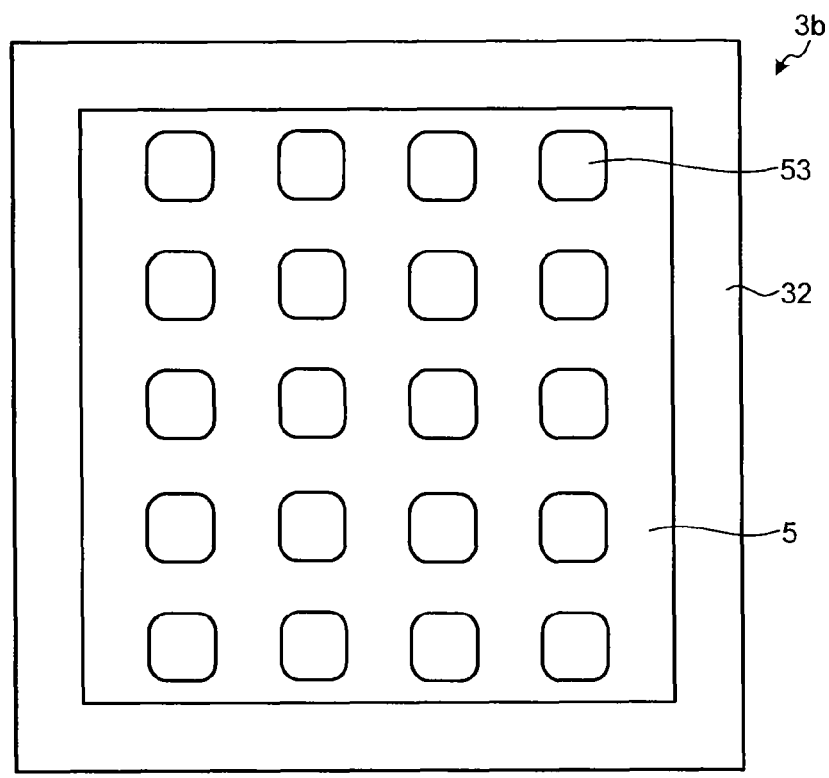
FIG. 6 is an explanatory diagram of a light-receiving surface in a photoelectric conversion element in plan view according to a second modified example.

Modified examples of the second P-type Si regions 51 according to the first embodiment will be described below with reference to FIGS. 5 and 6. FIG. 5 is an explanatory diagram of a light-receiving surface in a photoelectric conversion element 3a according to a first modified example as viewed from plane, and FIG. 6 is an explanatory diagram of a light-receiving surface in a photoelectric conversion element 3b according to a second modified example as viewed from plane. Further, in FIGS. 5 and 6, the same components as in FIG. 3 are denoted by the same reference numerals as in FIG. 3.

As illustrated in FIG. 5, the photoelectric conversion element 3a according to the first modified example includes a stripe-shaped second P-type Si region 52 which is disposed in a lattice pattern as viewed from plan. Further, similar to the second P-type Si region 51 illustrated in FIG. 3, the second P-type Si region 52 is also provided so as to protrude in the depth direction toward the N-type Si region 4 from the first P-type Si region 5. Thus, since the area of the PN junction is more enlarged, it is possible to further increase the number of saturated electrons.

In addition, as illustrated in FIG. 6, the photoelectric conversion element 3b according to the second modified example includes second P-type Si regions 53 which are provided in a form of plural dots on the light-receiving surface of the photoelectric conversion element 3b. Further, similar to the second P-type Si region 51 illustrated in FIG. 3, the second P-type Si region 53 is also provided so as to protrude in the depth direction toward the N-type Si region 4 from the first P-type Si region 5. Even by the second P-type Si regions 53, since the area of the PN junction is enlarged, it is possible to increase the number of saturated electrons.

A method of fabricating the solid-state image pickup device 14 provided with the photoelectric conversion element 3 will be described below. Further, in a fabricating process of the solid-state image pickup device 14, fabricating processes other than a forming process of the photoelectric conversion element 3 are the same as in the solid-state image pickup device, in general. Therefore, the forming process of the photoelectric conversion element 3 will be described herein, and the description of other fabricating processes will not be presented.

Figure 7A:
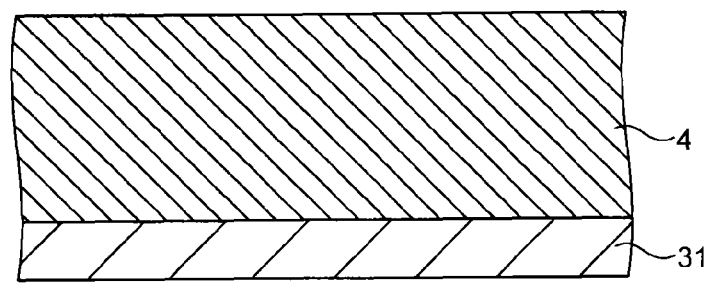
FIGS. 7A to 7D are explanatory diagrams illustrating forming processes of the photoelectric conversion element according to the first embodiment.

FIGS. 7A to 7D are explanatory diagrams illustrating the forming process of the photoelectric conversion element 3 according to the first embodiment. In the process of forming the photoelectric conversion element 3, first, as illustrated in FIG. 7A, the N-type Si region 4 is formed on the semiconductor substrate 31.

The N-type Si region 4 is formed by, for example, ion-implanting an N-type impurity such as phosphorus into the semiconductor substrate 31 and then performing an annealing treatment. Further, the N-type Si region 4 may be a Si layer doped with the N-type impurity, which is formed on the semiconductor substrate 31 by, for example, CVD (Chemical Vapor Deposition).

Figure 7B:
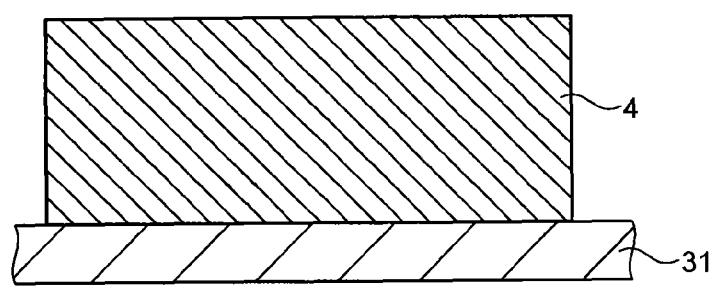
Figure 7C:
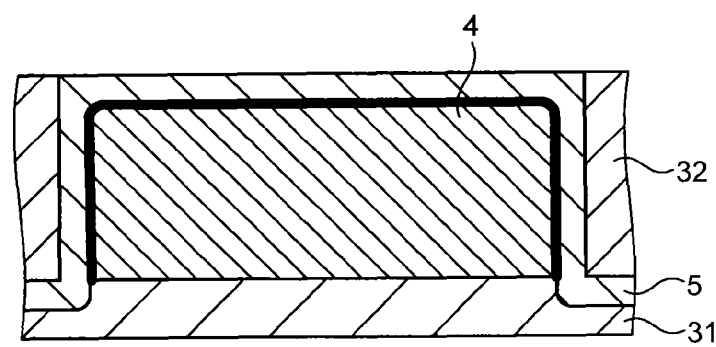

Thereafter, as illustrated in FIG. 7B, a trench (groove) is formed at a formation position of the STI 32 in the N-type Si region 4. Subsequently, as illustrated in FIG. 7C, the first P-type Si region 5 and the STI 32 are sequentially formed.

The first P-type Si region 5 is formed by, for example, ion-implanting a P-type impurity such as boron into the upper face, the lateral face (lateral face of trench), and the bottom face of the N-type Si region 4 and then performing the annealing treatment.

In addition, the STI 32 is formed by burying a silicon oxide in an interior of the trench in which the first P-type Si region 5 is formed at an inner periphery, using the CVD, for example. Further, in a state illustrated in FIG. 7C, the junction plane between the upper face of the N-type Si region 4 and the first P-type Si region 5 is a planar shape as illustrated by the thick line in FIG. 7C.

Figure 7D:
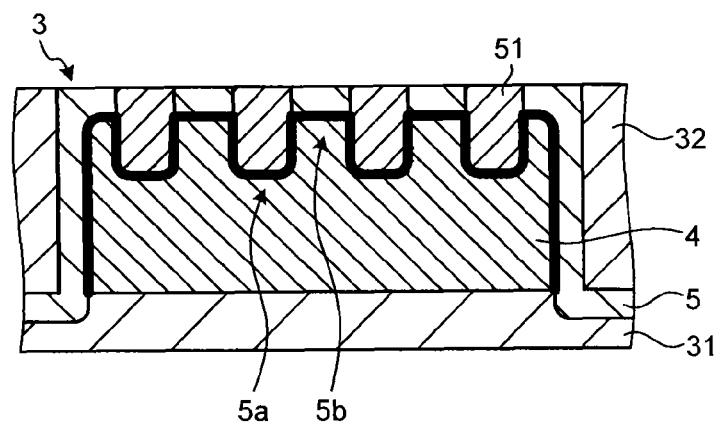

Subsequently, as illustrated in FIG. 7D, the second P-type Si region 51 is formed. The second P-type Si region 51 is formed by, for example, forming a mask provided with a stripe-shaped opening on the upper face of the first P-type Si region 5, ion-implanting the P-type impurity toward the N-type Si region 4 over the mask, and then performing the annealing treatment.

Further, in a case of forming the second P-type Si region 51, a higher energy is applied to the P-type impurity than in the case of forming the first P-type Si region 5 to perform the ion implantation. For this reason, the ion implantation of the P-type impurity into the interior of the N-type Si region 4 is conducted deeper than that of the P-type impurity into the first P-type Si region 5, and then the second P-type Si region 51 is formed so as to protrude in the depth direction toward the N-type Si region 4 from the first P-type Si region 5 by the annealing treatment.

As a result, in a state illustrated in FIG. 7D, the junction plane between the N-type Si region 4 and the P-type Si region is a concave/convex shape as illustrated by the thick line in FIG. 7D. Here, as is apparent from a comparison between FIGS. 7C and 7D, the area of the PN junction (see thick line illustrated in FIGS. 7C and 7D) after the formation of the second P-type Si regions 51 is larger than that before the formation of the second P-type Si regions 51.

Thus, in the forming process of the photoelectric conversion element 3, the second P-type Si region 51 is formed by ion-implanting the P-type impurity with energy higher than in the case of forming the first P-type Si region 5 to form the PN junction of the concave/convex shape.

For this reason, according to the photoelectric conversion element 3, even when the second P-type Si regions 51 is provided, since the area of the PN junction can be enlarged to increase the number of saturated electrons, it is possible to improve the reproduction characteristics of the picked-up image.

Further, in the example illustrated in FIGS. 7A to 7D, the second P-type Si region 51 is formed by the ion-implantation, but the second P-type Si region 51 may be formed by methods other than the ion-implantation.

For example, after a structure illustrated in FIG. 7C is formed, the N-type Si region 4 and the first P-type Si region 5 are patterned in the shape as illustrated in FIG. 7D by performing a patterning using a photolithography technique.

In this state, the region in which the second P-type Si region 51 illustrated in FIG. 7D is formed is the striped groove as viewed from plane. Then, the second P-type Si region 51 may be formed by burying Si, which is doped with the P-type impurity, in the groove by the CVD.

As described above, the photoelectric conversion element 3 according to the first embodiment is formed so that the junction plane between the N-type Si region 4 and the P-type Si region is the convex/concave shape. Thus, since the number of saturated electrons of each photoelectric conversion element 3 is increased, it is possible to improve the reproduction characteristics of the picked-up image. Further, the configurations of the photoelectric conversion elements 3, 3a, and 3b illustrated in FIGS. 3 to 6 are an example, and these configurations can variously be modified. A photoelectric conversion element according to other embodiments will be described below.

Second Embodiment

Figure 8:
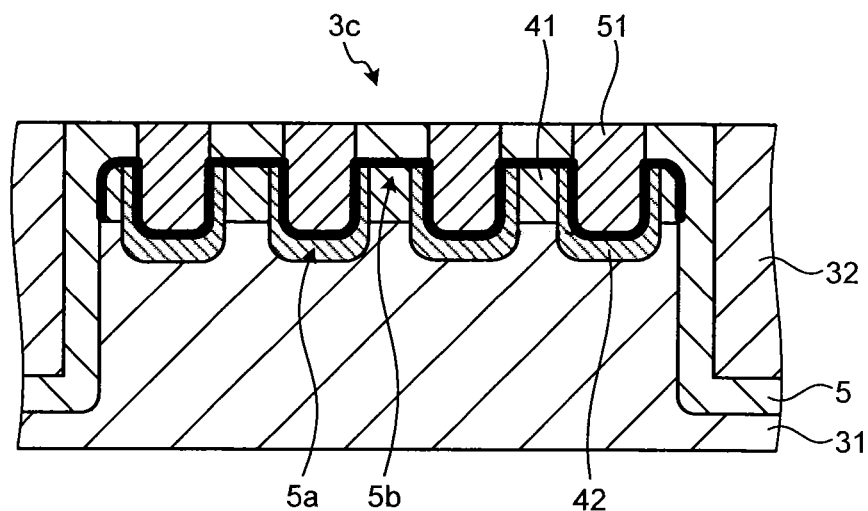
FIG. 8 is an explanatory diagram of a photoelectric conversion element in cross-sectional view according to a second embodiment.

FIG. 8 is an explanatory diagram of a photoelectric conversion element 3c according to a second embodiment as viewed from cross section. As illustrated in FIG. 8, the photoelectric conversion element 3c includes a first N-type Si region 41 which is formed more thinly than the N-type Si region 4 and a second N-type Si region 42 which is formed more deeply than the first N-type Si region 41, instead of the N-type Si region 4 illustrated in FIG. 3.

Furthermore, the photoelectric conversion element 3c is configured in the same manner as illustrated in FIG. 3, except that the first N-type Si region 41 and the second N-type Si region 42 illustrated in FIG. 8 are provided instead of the N-type Si region 4 illustrated in FIG. 3. For example, as viewed from plane, the second N-type Si region 42 may be formed in the parallel stripe shape as illustrated in FIG. 4, in the lattice pattern as illustrated in FIG. 5, and in the dot shape as illustrated in FIG. 6.

For example, the second N-type Si region 42 is formed by ion-implanting the N-type impurity into the semiconductor substrate 31 with the energy higher than in the case of forming the first N-type Si region 41.

For this reason, the second N-type Si region 42 is formed so as to protrude toward the semiconductor substrate 31 from the junction plane between the first N-type Si region 41 and the semiconductor substrate 31. Furthermore, the second N-type Si region 42 may also be formed by burying Si doped with the N-type impurity in the groove, which is formed by patterning the first N-type Si region 41 and the semiconductor substrate 31, using the CVD rather than the ion implantation.

According to the second embodiment, as illustrated by the thick line in FIG. 8, since the junction plane between the first and second N-type Si regions 41 and 42 and the P-type Si region is the convex/concave shape, it is possible to increase the number of saturated electrons compared to a case where the second P-type Si region 51 is not provided.

Further, according to the second embodiment, in a case of not forming deeply the first N-type Si region 41 for certain reasons, since the second N-type Si region 42 is provided to cover at least the second P-type Si regions 51, it is possible to form the PN junction of the convex/concave shape.

Third Embodiment

Figure 9:
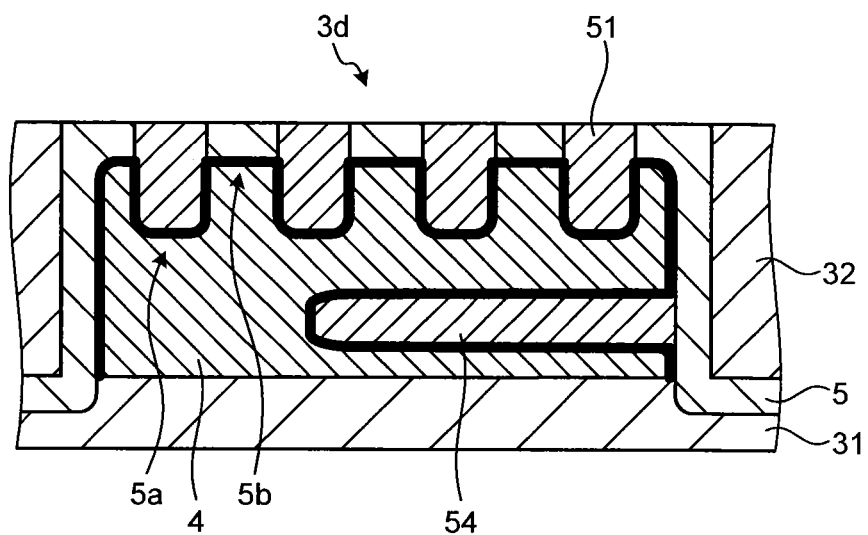
FIG. 9 is an explanatory diagram of a photoelectric conversion element in cross-sectional view according to a third embodiment.

FIG. 9 is an explanatory diagram of a photoelectric conversion element 3d according to a third embodiment as viewed from cross section. As illustrated in FIG. 9, the photoelectric conversion element 3d is configured in the same manner as the photoelectric conversion element 3 illustrated in FIG. 3, except that a third P-type Si region 54 is provided inside the N-type Si region 4. The third P-type Si region 54 is formed by ion-implanting the P-type impurity into the N-type Si region 4 with the energy higher than in the case of forming the second P-type Si regions 51.

According to the third embodiment, since the PN junction is also formed at an interface between the third P-type Si region 54 and the N-type Si region 4 to accumulate the photoelectrically converted electron, it is possible to further increase the number of saturated electrons.

Fourth Embodiment

Figure 10:
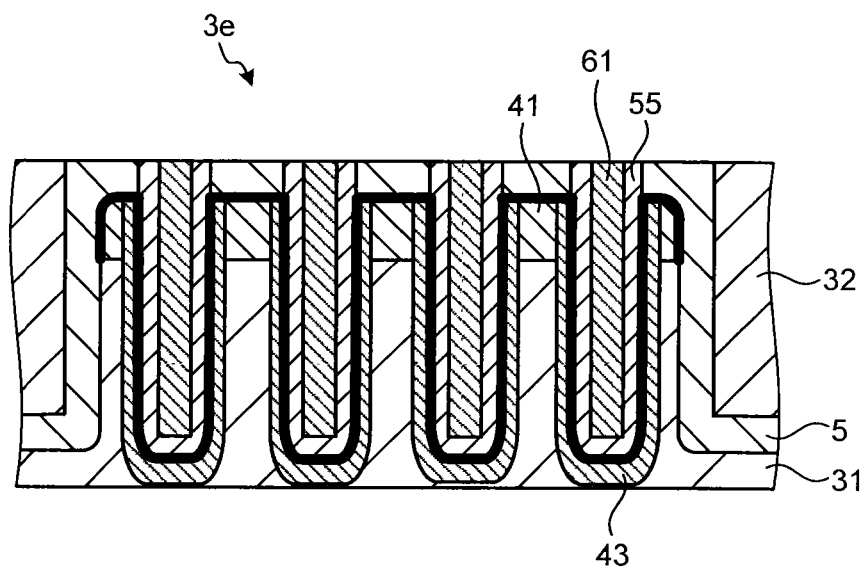
FIG. 10 is an explanatory diagram of a photoelectric conversion element in cross-sectional view according to a fourth embodiment.

FIG. 10 is an explanatory diagram of a photoelectric conversion element 3e according to a fourth embodiment as viewed from cross section. As illustrated in FIG. 10, the photoelectric conversion element 3e includes a second N-type Si region 43 which is formed more deeply up to a deep position of the semiconductor substrate 31 than the second N-type Si region 42 illustrated in FIG. 8.

In addition, the photoelectric conversion element 3e includes a second P-type Si region 55 which is provided inside the second N-type Si region 43 and is formed more deeply up to the deep position of the semiconductor substrate 31 than the second P-type Si region 51 illustrated in FIG. 8. Further, the photoelectric conversion element 3e includes an insulation region 61 which is formed inside the second P-type Si region 55 by an insulator such as Si oxide.

In the case of forming the photoelectric conversion element 3e, firstly, the structure illustrated in FIG. 7C is formed by the processes illustrated in FIGS. 7A to 7C. Subsequently, the trench is formed toward the depth direction in the semiconductor substrate 31 from predetermined positions of plural locations in the upper face of the first P-type Si region 5. The trench formed by the above process may be formed in the parallel stripe shape as viewed from plane, in the lattice pattern as viewed from plane, and in the dot shape as viewed from plane. Furthermore, the trench is back-filled by Si oxide.

Subsequently, the second N-type Si region 43 and the second P-type Si region 55 are formed by sequentially ion-implanting the N-type impurity and the P-type impurity into an inner periphery of the trench and then performing the annealing treatment. Finally, the insulation region 61 is formed by burying the insulator such as Si oxide inside the trench using, for example, the CVD, and the photoelectric conversion element 3e illustrated in FIG. 10 is formed.

Like this, according to the fourth embodiment, since the second N-type Si region 43 and the second P-type Si region 55 are formed by ion-implanting the N-type impurity and the P-type impurity into the inner periphery of the trench after the formation of the trench, the PN junction is formed up to the deeper position of the semiconductor substrate 31.

Therefore, according to the fourth embodiment, since the PN junction formed in the photoelectric conversion element 3e further extends toward the depth direction of the semiconductor substrate 31, it is possible to further increase the number of saturated electrons.

Fifth Embodiment

Figure 11:
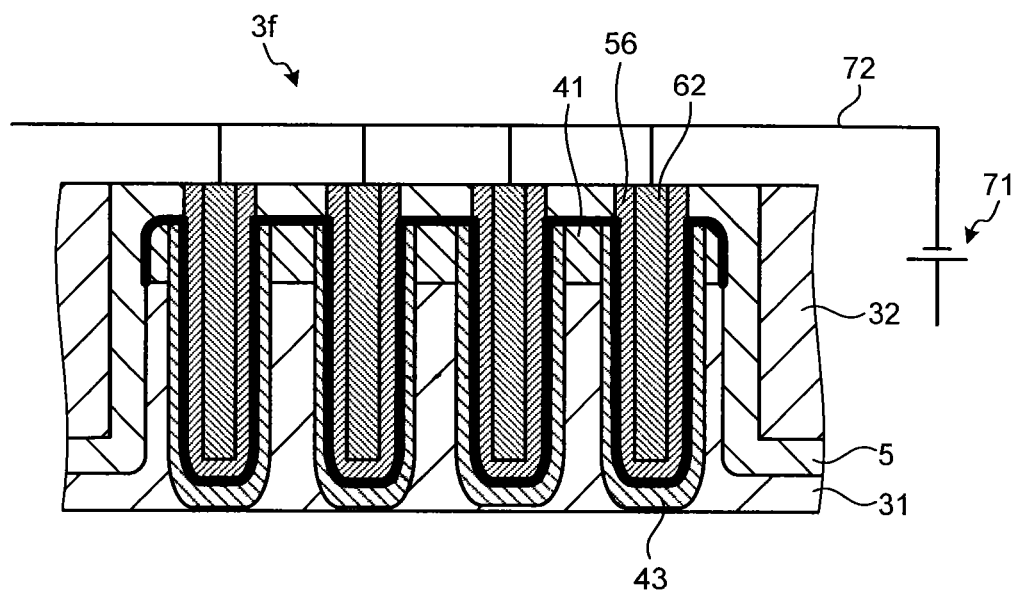
FIG. 11 is an explanatory diagram of a photoelectric conversion element in cross-sectional view according to a fifth embodiment.

FIG. 11 is an explanatory diagram of a photoelectric conversion element 3f according to a fifth embodiment as viewed from cross section. As illustrated in FIG. 11, the photoelectric conversion element 3f differs from that illustrated in FIG. 10 in that the second P-type Si region 55 illustrated in FIG. 10 is not provided and a conductive region 62 is provided in place of the insulation region 61. In addition, the conductive region 62 of the photoelectric conversion element 3f is connected to a DC power source 71 through a wiring 72, and a negative voltage is applied to the conductive region 62 from the DC power source 71.

The photoelectric conversion element 3f is formed without using the process of forming the second P-type Si region 55 in the process of forming the photoelectric conversion element 3e illustrated in FIG. 10 and by burying a conductor such as a poly-Si in the trench using, for example, the CVD, instead of the process of forming the insulation region 61.

In the photoelectric conversion element 3f, when the negative voltage is applied to the conductive region 62, an inversion region 56 in which positive and negative of electrical characteristics are inverted is formed at a portion which comes in contact with the conductive region 62 in the second N-type Si region 43. The inversion region 56 has the same function as the second P-type Si regions 55 illustrated in FIG. 10.

Therefore, according to the fifth embodiment, even without using the process of forming the second P-type Si region 55 (FIG. 10), since the PN junction further extends toward the depth direction of the semiconductor substrate 31 as in the fourth embodiment, it is possible to much more increase the number of saturated electrons.

Further, a material of the conductive region 62 in the fifth embodiment is not limited to the poly-Si, but may be a transparent electrode material represented by, for example, ITO (Indium Tin Oxide). In the case of using the transparent electrode material as the material of the conductive region 62, it is possible to increase the quantity of saturated electrons while suppressing the quantity of incident light which enters the photoelectric conversion element 3f.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state image pickup device comprising:
   a pixel array that comprises a two-dimensionally arranged matrix of photoelectric conversion elements corresponding to pixels of a picked-up image,
   each of the photoelectric conversion elements including a first conductive semiconductor region and a second conductive semiconductor region between which an uneven junction plane is formed,
   wherein the second conductive semiconductor region includes:
   a first second-conductive region that is provided on a surface of a side which light enters in the first conductive semiconductor region; and
   a second second-conductive region that protrudes toward the first conductive semiconductor region from a junction plane between the first second-conductive region and the first conductive semiconductor region.

2. The solid-state image pickup device according to claim 1, wherein the junction plane has a dotted convex portion.

3. The solid-state image pickup device according to claim 1, wherein the first conductive semiconductor region includes:
   a first first-conductive region that is provided on a semiconductor substrate; and
   a second first-conductive region that protrudes toward the semiconductor substrate from a junction plane between the first first-conductive region and the semiconductor substrate.

4. The solid-state image pickup device according to claim 1, further comprising:
   a second conductive semiconductor region provided inside the first conductive semiconductor region.

5. The solid-state image pickup device according to claim 1, wherein the second region of the second conductive semiconductor region includes a trench formed toward an inside of the second region from a surface of a side which light enters, and an insulation region formed by an insulator is provided inside the trench.

6. The solid-state image pickup device according to claim 1, further comprising:
   a power source that supplies a negative voltage; and
   a wiring that is connected to the power source,
   wherein the second region of the second conductive semiconductor region includes a trench formed toward an inside of the second region from a surface of a side which light enters, and a conductive region formed by a conductor to which the negative voltage is applied through the wiring is provided inside the trench.

7. The solid-state image pickup device according to claim 1, wherein the junction plane includes striped convex and concave portions which are arranged in parallel with a light-receiving surface of the photoelectric conversion element.

8. The solid-state image pickup device according to claim 7, wherein the striped convex and concave portions are provided in a lattice pattern.

9. A camera module comprising:
   an imaging optical system that receives light from an object to form an object image; and
   a solid-state image pickup device that picks up the object image formed by the imaging optical system, and
   the solid-state image pickup device comprising a pixel array that comprises a two-dimensionally arranged matrix of photoelectric conversion elements corresponding to pixels of a picked-up image, each of the photoelectric conversion elements including a first conductive semiconductor region and a second conductive semiconductor region between which an uneven junction plane is formed, wherein
the second conductive semiconductor region includes:
a first second-conductive region that is provided on a surface of a side which light enters in the first conductive semiconductor region; and
a second second-conductive region that protrudes toward the first conductive semiconductor region from a junction plane between the first second-conductive region and the first conductive semiconductor region.

* * * * *